(12) United States Patent
Garrison Stuber et al.

(10) Patent No.: US 8,494,792 B2
(45) Date of Patent: *Jul. 23, 2013

(54) DISTRIBUTING METERING RESPONSES FOR LOAD BALANCING AN AMR NETWORK

(75) Inventors: Michael T. Garrison Stuber, Newman Lake, WA (US); John Buffington, Hauser, ID (US)

(73) Assignee: Itron, Inc., Liberty Lake, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/290,844

(22) Filed: Nov. 7, 2011

(65) Prior Publication Data

US 2012/0053902 A1    Mar. 1, 2012

Related U.S. Application Data

(63) Continuation of application No. 11/900,913, filed on Sep. 13, 2007, now Pat. No. 8,055,461.

(60) Provisional application No. 60/845,058, filed on Sep. 15, 2006, provisional application No. 60/845,059, filed on Sep. 15, 2006.

(51) Int. Cl.
*G01R 21/00* (2006.01)

(52) U.S. Cl.
USPC ......................................................... 702/62

(58) Field of Classification Search
USPC ............. 702/62, 80, 122, 123, 126, 176, 177, 702/188; 709/229, 230; 340/4.32, 4.33, 7.29, 340/12.25, 12.4
See application file for complete search history.

(56) References Cited

U.S. PATENT DOCUMENTS

| | | |
|---|---|---|
| 4,638,298 A | 1/1987 | Spiro |
| 4,692,761 A | 9/1987 | Robinton |
| 4,792,946 A | 12/1988 | Mayo |
| 4,799,062 A | 1/1989 | Sanderford, Jr. et al. |
| 4,937,569 A | 6/1990 | Trask et al. |
| 4,977,577 A | 12/1990 | Arthur et al. |
| 4,998,102 A | 3/1991 | Wyler et al. |
| 5,032,833 A | 7/1991 | Laporte |
| 5,067,136 A | 11/1991 | Arthur et al. |
| 5,095,493 A | 3/1992 | Arthur et al. |
| 5,119,396 A | 6/1992 | Snderford, Jr. |
| 5,198,796 A | 3/1993 | Hessling, Jr. |

(Continued)

FOREIGN PATENT DOCUMENTS

| | | |
|---|---|---|
| EP | 0629098 | 12/1994 |
| GB | 2230629 | 10/1990 |

*Primary Examiner* — Mohamed Charioui
(74) *Attorney, Agent, or Firm* — Dority & Manning, P.A.

(57) ABSTRACT

Disclosed are methodology and corresponding apparatus subject matters for providing improved efficiency in the collection of data from a large number of metrology devices associated with an Automated Meter reading (AMR) network. AMR network operation produces randomly spaced transmissions from individual nodes in the network. When an AMR system wishes to retrieve data from a large number of points over an AMR network, a broadcast or multicast request is transmitted to appropriate nodes. A time window is defined either in such request or in the devices themselves such that start and end offsets from the time of the request are received by the node. The start offset provides a quiet period to insure request delivery to all the appropriate nodes. The end offset provides a time by which the requested data must be returned. Responses are sent randomly within the window established by the start and stop offset times.

23 Claims, 4 Drawing Sheets

U.S. PATENT DOCUMENTS

| | | |
|---|---|---|
| 5,265,120 A | 11/1993 | Sanderford, Jr. |
| 5,310,075 A | 5/1994 | Wyler |
| 5,311,541 A | 5/1994 | Sanderford, Jr. |
| 5,377,222 A | 12/1994 | Sanderford, Jr. |
| 5,377,232 A | 12/1994 | Davidov et al. |
| 5,438,329 A | 8/1995 | Gastouniotis et al. |
| 5,457,713 A | 10/1995 | Sanderford, Jr. et al. |
| 5,486,805 A | 1/1996 | Mak |
| 5,491,473 A | 2/1996 | Gilbert |
| 5,548,633 A | 8/1996 | Kujawa et al. |
| 5,598,427 A | 1/1997 | Arthur et al. |
| 5,604,768 A | 2/1997 | Fulton |
| 5,626,755 A | 5/1997 | Keyser et al. |
| 5,661,750 A | 8/1997 | Fulton |
| 5,668,828 A | 9/1997 | Sanderford, Jr. et al. |
| 5,696,441 A | 12/1997 | Mak et al. |
| 5,714,931 A | 2/1998 | Petite et al. |
| 5,748,104 A | 5/1998 | Argyroudis et al. |
| RE35,829 E | 6/1998 | Sanderford, Jr. |
| 5,801,643 A | 9/1998 | Williams et al. |
| 5,874,903 A | 2/1999 | Shuey et al. |
| 5,892,758 A | 4/1999 | Argyroudis |
| 5,920,589 A | 7/1999 | Rouquette et al. |
| 5,923,269 A | 7/1999 | Shuey et al. |
| 5,926,531 A | 7/1999 | Petite |
| 5,933,072 A | 8/1999 | Kelley |
| 5,953,368 A | 9/1999 | Sanderford et al. |
| 5,986,574 A | 11/1999 | Colton |
| 5,987,058 A | 11/1999 | Sanderford et al. |
| 6,014,089 A | 1/2000 | Tracy et al. |
| 6,028,522 A | 2/2000 | Petite |
| 6,031,883 A | 2/2000 | Sanderford, Jr. et al. |
| 6,044,062 A | 3/2000 | Brownrigg et al. |
| 6,047,016 A | 4/2000 | Ramberg et al. |
| 6,069,571 A | 5/2000 | Tell |
| 6,078,785 A | 6/2000 | Bush |
| 6,100,816 A | 8/2000 | Moore |
| 6,100,817 A | 8/2000 | Mason, Jr. et al. |
| 6,160,992 A | 12/2000 | Laham et al. |
| 6,163,276 A | 12/2000 | Irving et al. |
| 6,178,197 B1 | 1/2001 | Froelich et al. |
| 6,181,258 B1 | 1/2001 | Summers et al. |
| 6,195,018 B1 | 2/2001 | Ragle et al. |
| 6,218,953 B1 | 4/2001 | Petite |
| 6,232,885 B1 | 5/2001 | Ridenour et al. |
| 6,233,327 B1 | 5/2001 | Petite |
| 6,239,722 B1 | 5/2001 | Colton et al. |
| 6,246,677 B1 | 6/2001 | Nap et al. |
| 6,249,516 B1 | 6/2001 | Brownrigg et al. |
| 6,263,009 B1 | 7/2001 | Ramberg et al. |
| 6,335,953 B1 | 1/2002 | Sanderford, Jr. et al. |
| 6,363,057 B1 | 3/2002 | Ardalan et al. |
| 6,369,769 B1 | 4/2002 | Nap et al. |
| 6,377,609 B1 | 4/2002 | Brennan, Jr. |
| 6,396,839 B1 | 5/2002 | Ardalan et al. |
| 6,424,270 B1 | 7/2002 | Ali |
| 6,426,027 B1 | 7/2002 | Scarborough, III et al. |
| 6,430,268 B1 | 8/2002 | Petite |
| 6,437,692 B1 | 8/2002 | Petite et al. |
| 6,452,986 B1 | 9/2002 | Luxford et al. |
| 6,456,644 B1 | 9/2002 | Ramberg et al. |
| 6,509,841 B1* | 1/2003 | Colton et al. ............ 340/870.11 |
| 6,512,463 B1* | 1/2003 | Campbell et al. ........ 340/870.02 |
| 6,538,577 B1 | 3/2003 | Ehrke et al. |
| 6,604,434 B1 | 8/2003 | Hamilton et al. |
| 6,612,188 B2 | 9/2003 | Hamilton |
| 6,617,879 B1 | 9/2003 | Chung |
| 6,617,976 B2 | 9/2003 | Walden et al. |
| 6,617,978 B2 | 9/2003 | Ridenour et al. |
| 6,618,578 B1 | 9/2003 | Petite |
| 6,626,048 B1 | 9/2003 | Dam Es et al. |
| 6,628,764 B1 | 9/2003 | Petite |
| 6,639,939 B1 | 10/2003 | Naden et al. |
| 6,650,249 B2 | 11/2003 | Meyer et al. |
| 6,657,552 B2 | 12/2003 | Belski et al. |
| 6,671,586 B2 | 12/2003 | Davis et al. |
| 6,700,902 B1 | 3/2004 | Meyer |
| 6,704,301 B2 | 3/2004 | Chari et al. |
| 6,734,663 B2 | 5/2004 | Fye et al. |
| 6,747,557 B1 | 6/2004 | Petite et al. |
| 6,747,981 B2 | 6/2004 | Ardalan et al. |
| 6,778,099 B1 | 8/2004 | Meyer et al. |
| 6,784,807 B2 | 8/2004 | Petite et al. |
| 6,816,538 B2 | 11/2004 | Shuey et al. |
| 6,836,108 B1 | 12/2004 | Balko et al. |
| 6,836,737 B2 | 12/2004 | Petite et al. |
| 6,850,197 B2 | 2/2005 | Paun |
| 6,859,186 B2 | 2/2005 | Lizalek et al. |
| 6,862,498 B2 | 3/2005 | Davis et al. |
| 6,867,707 B1 | 3/2005 | Kelley et al. |
| 6,885,309 B1 | 4/2005 | Van Heteren |
| 6,891,838 B1 | 5/2005 | Petite et al. |
| 6,900,737 B1 | 5/2005 | Ardalan et al. |
| 6,914,533 B2 | 7/2005 | Petite |
| 6,914,893 B2 | 7/2005 | Petite |
| 6,918,311 B2 | 7/2005 | Nathan |
| 6,931,445 B2 | 8/2005 | Davis |
| 6,940,396 B2 | 9/2005 | Hammond et al. |
| 6,961,666 B2 | 11/2005 | Comas Romero et al. |
| 6,965,575 B2 | 11/2005 | Srikrishna et al. |
| 6,972,555 B2 | 12/2005 | Balko et al. |
| 6,982,651 B2 | 1/2006 | Fischer |
| 7,019,667 B2 | 3/2006 | Petite et al. |
| 7,046,682 B2 | 5/2006 | Carpenter et al. |
| 7,053,767 B2 | 5/2006 | Petite et al. |
| 7,054,271 B2 | 5/2006 | Brownrigg et al. |
| 7,079,810 B2 | 7/2006 | Petite et al. |
| 7,103,511 B2 | 9/2006 | Petite |
| 7,126,494 B2 | 10/2006 | Ardalan et al. |
| 7,137,550 B1 | 11/2006 | Petite |
| 7,184,861 B2 | 2/2007 | Petite |
| 7,209,840 B2 | 4/2007 | Petite et al. |
| 7,263,073 B2 | 8/2007 | Petite et al. |
| 7,295,128 B2 | 11/2007 | Petite |
| 7,317,404 B2* | 1/2008 | Cumeralto et al. ...... 340/870.02 |
| 7,346,463 B2 | 3/2008 | Petite et al. |
| 7,397,907 B2 | 7/2008 | Petite |
| 7,400,264 B2* | 7/2008 | Boaz ........................ 340/870.02 |
| 7,417,557 B2* | 8/2008 | Osterloh et al. ......... 340/870.03 |
| 7,424,527 B2 | 9/2008 | Petite |
| 7,444,401 B1* | 10/2008 | Keyghobad et al. .......... 709/224 |
| 7,468,661 B2 | 12/2008 | Petite et al. |
| 7,650,425 B2 | 1/2010 | Davis et al. |
| 2002/0019725 A1 | 2/2002 | Petite |
| 2002/0146985 A1 | 10/2002 | Naden |
| 2002/0169643 A1 | 11/2002 | Petite et al. |
| 2003/0036810 A1 | 2/2003 | Petite |
| 2003/0048199 A1 | 3/2003 | Zigdon et al. |
| 2003/0063723 A1 | 4/2003 | Booth et al. |
| 2003/0078029 A1 | 4/2003 | Petite |
| 2003/0093484 A1 | 5/2003 | Petite |
| 2003/0103486 A1 | 6/2003 | Salt et al. |
| 2003/0179149 A1 | 9/2003 | Savage et al. |
| 2004/0004555 A1 | 1/2004 | Martin |
| 2004/0008663 A1 | 1/2004 | Srikrishna et al. |
| 2004/0040368 A1 | 3/2004 | Guckenberger et al. |
| 2004/0053639 A1 | 3/2004 | Petite et al. |
| 2004/0061623 A1 | 4/2004 | Tootoonian Mashhad et al. |
| 2004/0062224 A1 | 4/2004 | Brownrigg et al. |
| 2004/0085928 A1 | 5/2004 | Chari et al. |
| 2004/0088083 A1 | 5/2004 | Davis et al. |
| 2004/0131125 A1 | 7/2004 | Sanderford, Jr. et al. |
| 2004/0183687 A1 | 9/2004 | Petite et al. |
| 2004/0192415 A1 | 9/2004 | Luglio et al. |
| 2004/0218616 A1 | 11/2004 | Ardalan et al. |
| 2004/0264379 A1 | 12/2004 | Srikrishna et al. |
| 2004/0264435 A1 | 12/2004 | Chari et al. |
| 2005/0021836 A1* | 1/2005 | Reed et al. .................... 709/238 |
| 2005/0024235 A1 | 2/2005 | Shuey et al. |
| 2005/0030199 A1 | 2/2005 | Petite et al. |
| 2005/0036487 A1 | 2/2005 | Srikrishna |
| 2005/0043059 A1 | 2/2005 | Petite et al. |
| 2005/0043860 A1 | 2/2005 | Petite |
| 2005/0044213 A1 | 2/2005 | Kobayashi et al. |
| 2005/0052290 A1 | 3/2005 | Naden et al. |
| 2005/0052328 A1 | 3/2005 | De Angelis |
| 2005/0068194 A1 | 3/2005 | Schleich et al. |

| | | |
|---|---|---|
| 2005/0068970 A1 | 3/2005 | Srikrishna et al. |
| 2005/0074015 A1 | 4/2005 | Chari et al. |
| 2005/0129005 A1 | 6/2005 | Srikrishna et al. |
| 2005/0147097 A1 | 7/2005 | Chari et al. |
| 2005/0163144 A1 | 7/2005 | Srikrishna et al. |
| 2005/0169020 A1 | 8/2005 | Knill |
| 2005/0171696 A1 | 8/2005 | Naden et al. |
| 2005/0172024 A1 | 8/2005 | Cheifot et al. |
| 2005/0190055 A1 | 9/2005 | Petite |
| 2005/0195768 A1 | 9/2005 | Petite et al. |
| 2005/0195775 A1 | 9/2005 | Petite et al. |
| 2005/0201397 A1 | 9/2005 | Petite |
| 2005/0218873 A1 | 10/2005 | Shuey et al. |
| 2005/0226179 A1 | 10/2005 | Behroozi |
| 2005/0237221 A1 | 10/2005 | Brian et al. |
| 2005/0243867 A1 | 11/2005 | Petite |
| 2005/0251401 A1 | 11/2005 | Shuey |
| 2005/0251403 A1 | 11/2005 | Shuey |
| 2005/0271006 A1 | 12/2005 | Chari et al. |
| 2005/0278440 A1 | 12/2005 | Scoggins |
| 2006/0002350 A1 | 1/2006 | Behroozi |
| 2006/0012935 A1 | 1/2006 | Murphy |
| 2006/0018303 A1 | 1/2006 | Sugiarto et al. |
| 2006/0038548 A1 | 2/2006 | Shuey |
| 2006/0043961 A1 | 3/2006 | Loy |
| 2006/0071810 A1 | 4/2006 | Scoggins et al. |
| 2006/0071812 A1 | 4/2006 | Mason, Jr. et al. |
| 2006/0098576 A1 | 5/2006 | Brownrigg et al. |
| 2007/0125973 A1 | 6/2007 | Koishikawa |
| 2008/0186898 A1 | 8/2008 | Petite |
| 2009/0068947 A1 | 3/2009 | Petite |

* cited by examiner

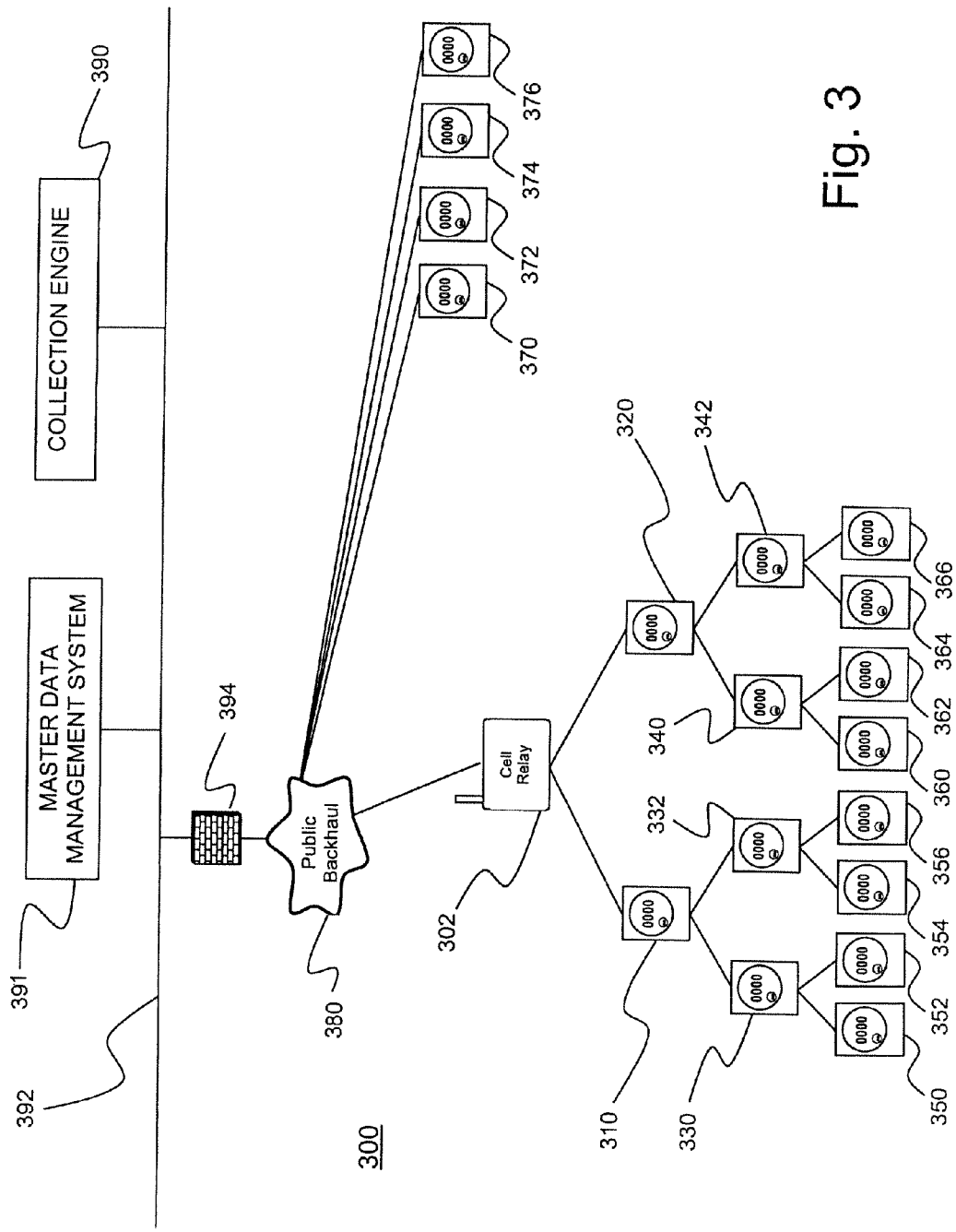

DISTRIBUTING METERING RESPONSES FOR LOAD BALANCING AN AMR NETWORK

PRIORITY CLAIM

This application claims the benefit of previously filed U.S. Provisional Patent Applications U.S. Ser. No. 60/845,059, filed Sep. 15, 2006, and U.S. Ser. No. 60/845,058, filed Sep. 15, 2006, both of which are hereby incorporated herein by reference in their entireties for all purposes.

FIELD OF THE INVENTION

The present technology relates to utility meters. More particularly, the present technology relates to methodologies for improving the collection of data from a large number of utility meters in an open operational framework, including such as providing load balancing when retrieving large amounts of data from such a network of such meters.

BACKGROUND OF THE INVENTION

The general object of metrology is to monitor one or more selected physical phenomena to permit a record of monitored events. Such basic purpose of metrology can be applied to a variety of metering devices used in a number of contexts. One broad area of measurement relates, for example, to utility meters. Such role may also specifically include, in such context, the monitoring of the consumption or production of a variety of forms of energy or other commodities, for example, including but not limited to, electricity, water, gas, or oil.

More particularly concerning electricity meters, mechanical forms of registers have been historically used for outputting accumulated electricity consumption data. Such an approach provided a relatively dependable field device, especially for the basic or relatively lower level task of simply monitoring accumulated kilowatt-hour consumption.

The foregoing basic mechanical form of register was typically limited in its mode of output, so that only a very basic or lower level metrology function was achieved. Subsequently, electronic forms of metrology devices began to be introduced, to permit relatively higher levels of monitoring, involving different forms and modes of data.

In the context of electricity meters specifically, for a variety of management and billing purposes, it became desirable to obtain usage data beyond the basic kilowatt-hour consumption readings available with many electricity meters. For example, additional desired data included rate of electricity consumption, or date and time of consumption (so-called "time of use" data). Solid state devices provided on printed circuit boards, for example, utilizing programmable integrated circuit components, have provided effective tools for implementing many of such higher level monitoring functions desired in the electricity meter context.

In addition to the beneficial introduction of electronic forms of metrology, a variety of electronic registers have been introduced with certain advantages. Still further, other forms of data output have been introduced and are beneficial for certain applications, including wired transmissions, data output via radio frequency transmission, pulse output of data, and telephone line connection via such as modems or cellular linkups.

The advent of such variety and alternatives has often required utility companies to make choices about which technologies to utilize. Such choices have from time to time been made based on philosophical points and preferences and/or based on practical points such as, training and familiarity of field personnel with specific designs.

Another aspect of the progression of technology in such area of metrology is that various retrofit arrangements have been instituted. For example, some attempts have been made to provide basic metering devices with selected more advanced features without having to completely change or replace the basic meter in the field. For example, attempts have been made to outfit a basically mechanical metering device with electronic output of data, such as for facilitating radio telemetry linkages.

Another aspect of the electricity meter industry is that utility companies have large-scale requirements, sometimes involving literally hundreds of thousands of individual meter installations, or data points. Implementing incremental changes in technology, such as retrofitting new features into existing equipment, or attempting to implement changes to basic components which make various components not interchangeable with other configurations already in the field, can generate considerable industry problems.

Electricity meters typically include input circuitry for receiving voltage and current signals at the electrical service. Input circuitry of whatever type or specific design for receiving the electrical service current signals is referred to herein generally as current acquisition circuitry, while input circuitry of whatever type or design for receiving the electrical service voltage signals is referred to herein generally as voltage acquisition circuitry.

Electricity meter input circuitry may be provided with capabilities of monitoring one or more phases, depending on whether monitoring is to be provided in a single or multiphase environment. Moreover, it is desirable that selectively configurable circuitry may be provided so as to enable the provision of new, alternative or upgraded services or processing capabilities within an existing metering device. Such variations in desired monitoring environments or capabilities, however, lead to the requirement that a number of different metrology configurations be devised to accommodate the number of phases required or desired to be monitored or to provide alternative, additional or upgraded processing capability within a utility meter.

More recently a new ANSI protocol, ANSI C12.22, is being developed that may be used to permit open protocol communications among metrology devices from various manufacturers. C12.22 is the designation of the latest sub-class of the ANSI C12.xx family of Meter Communication and Data standards presently under development. Presently defined standards include ANSI C12.18 relating to protocol specifications for Type 2 optical ports; ANSI C12.19 relating to Utility industry Meter Data Table definitions; and ANSI C12.21 relating to Plain Old Telephone Service (POTS) transport of C12.19 Data Tables definition. It should be appreciated that while the remainder of the present discussion may describe C12.22 as a standard protocol, that, at least at the time of filing the present application, such protocol is still being developed so that the present disclosure is actually intended to describe an open protocol that may be used as a communications protocol for networked metrology and is referred to for discussion purposes as the C12.22 standard or C12.22 protocol.

C12.22 is an application layer protocol that provides for the transport of C12.19 data tables over any network medium. Current standards for the C12.22 protocol include: authentication and encryption features; addressing methodology providing unique identifiers for corporate, communication, and end device entities; self describing data models; and message routing over heterogeneous networks.

Much as HTTP protocol provides for a common application layer for web browsers, C12.22 provides for a common application layer for metering devices. Benefits of using such a standard include the provision of: a methodology for both session and session-less communications; common data encryption and security; a common addressing mechanism for use over both proprietary and non-proprietary network mediums; interoperability among metering devices within a common communication environment; system integration with third-party devices through common interfaces and gateway abstraction; both 2-way and 1-way communications with end devices; and enhanced security, reliability and speed for transferring meter data over heterogeneous networks.

To understand why utilities are keenly interested in open protocol communications; consider the process and ease of sending e-mails from a laptop computer or a smart phone. Internet providers depend on the use of open protocols to provide e-mail service. E-mails are sent and received as long as e-mail addresses are valid, mailboxes are not full, and communication paths are functional. Most e-mail users have the option of choosing among several Internet providers and several technologies, from dial-up to cellular to broadband, depending mostly on the cost, speed, and mobility. The e-mail addresses are in a common format, and the protocols call for the e-mail to be carried by communication carriers without changing the e-mail. The open protocol laid out in the ANSI C.12.22 standard provides the same opportunity for meter communications over networks.

In addition, the desire for increased processing capabilities as well as other considerations including, but not limited to, a desire to collect data from a large number of individual metrology components in an open operational framework, leads to requirements for efficiently controlling collection of such data.

As such, it is desired to provide an improved methodology for improving the collection of data from a large number of utility meters in an open operational framework.

While various aspects and alternative embodiments may be known in the field of utility metering, no one design has emerged that generally encompasses the above-referenced characteristics and other desirable features associated with utility metering technology as herein presented.

SUMMARY OF THE INVENTION

In view of the recognized features encountered in the prior art and addressed by the present subject matter, improved methodology and corresponding apparatus allowing efficient responses from metrology devices to requests for data from a requester in an Automated Meter Reading (AMR) network have been provided.

In exemplary arrangements, methodology and apparatus have been provided to permit transmission of information between a utility meter and an operational application through a network.

In one of its simpler forms, the present technology provides a broadcast request for information from utility meters that specifies a time after which a meter is to reply.

One positive aspect of the present technology allows significant amounts of data to be obtained using minimal amounts of management.

Another positive aspect of the present technology provides data collection within prescribed intervals while avoiding network overloading.

Yet another positive aspect of the methodology of the present subject matter is that transmission of data may be made relatively constant thereby avoiding spikes in network traffic.

One exemplary present embodiment relates to an advanced metering system with meter response load balancing, comprising a plurality of end devices, at least some of which end devices comprise metrology devices; and a network including a central facility having collection functionality. Such network is preferably configured for bi-directional communications between the central facility and each of the plurality of end devices, while the collection functionality is preferably configured so as to broadcast to at least some of such metrology devices a request for data, which request for data includes metrology device instructions for responding to such request for data.

In one present variation of such embodiment, such metrology device instructions may preferably include a start offset and an end offset, thereby defining a metrology device response period, and also preferably such metrology devices responding to the request for data are configured for respectively responding at random times within such defined metrology device response period. Additional variations and other features may be alternatively practiced.

In another present exemplary alternative embodiment, an exemplary such advanced metering system with meter response load balancing may comprise a plurality of end devices, at least some of which end devices comprise metrology devices respectively having preprogrammed protocols for responding to requests for data; and a network including a central facility having collection functionality. Such network is preferably configured for bi-directional communications between the central facility and each of the plurality of end devices, while the collection functionality is preferably configured so as to broadcast to at least some of such metrology devices a request for data.

In one present variation of such embodiment, such preprogrammed protocols of such metrology devices may respectively include a start offset and an end offset, thereby defining a metrology device response period; and such metrology devices responding to such request for data may be configured for respectively responding at random times within such defined metrology device response period.

Still further, it is to be understood that the present subject matter equally relates to associated methodologies. One exemplary such methodology for an advanced metering system with meter response load balancing may preferably comprise providing a plurality of end devices, at least some of which end devices comprise metrology devices; establishing a network including a central facility having collection functionality; configuring the network for bi-directional communications between such central facility and each of the plurality of end devices; and using such collection functionality to broadcast to at least some of the metrology devices a request for data, which request for data includes metrology device instructions for responding to the request for data.

Another present alternative exemplary methodology may relate to methodology for an advanced metering system with meter response load balancing, comprising providing a plurality of end devices, at least some of which end devices comprise metrology devices respectively having preprogrammed protocols for responding to requests for data; establishing a network including a central facility having collection functionality; configuring the network for bi-directional communications between such central facility and each of the plurality of end devices; and using such collection functionality to broadcast to at least some of the metrology devices a request for data.

Additional objects and advantages of the present subject matter are set forth in, or will be apparent to, those of ordinary skill in the art from the detailed description herein. Also, it should be further appreciated that modifications and variations to the specifically illustrated, referred and discussed features, elements, and steps hereof may be practiced in various embodiments and uses of the present subject matter without departing from the spirit and scope of the subject matter. Variations may include, but are not limited to, substitution of equivalent means, features, or steps for those illustrated, referenced, or discussed, and the functional, operational, or positional reversal of various parts, features, steps, or the like.

Still further, it is to be understood that different embodiments, as well as different presently preferred embodiments, of the present subject matter may include various combinations or configurations of presently disclosed features, steps, or elements, or their equivalents including combinations of features, parts, or steps or configurations thereof not expressly shown in the figures or stated in the detailed description of such figures. Additional embodiments of the present subject matter, not necessarily expressed in the summarized section, may include and incorporate various combinations of aspects of features, components, or steps referenced in the summarized objects above, and/or other features, components, or steps as otherwise discussed in this application. Those of ordinary skill in the art will better appreciate the features and aspects of such embodiments, and others, upon review of the remainder of the specification.

BRIEF DESCRIPTION OF THE DRAWINGS

A full and enabling disclosure of the present subject matter, including the best mode thereof, directed to one of ordinary skill in the art, is set forth in the specification, which makes reference to the appended figures, in which:

FIG. 3 illustrates an exemplary Advanced Metering System deployment incorporating various methodology and corresponding apparatus aspects of the present subject matter.

Figure 1:
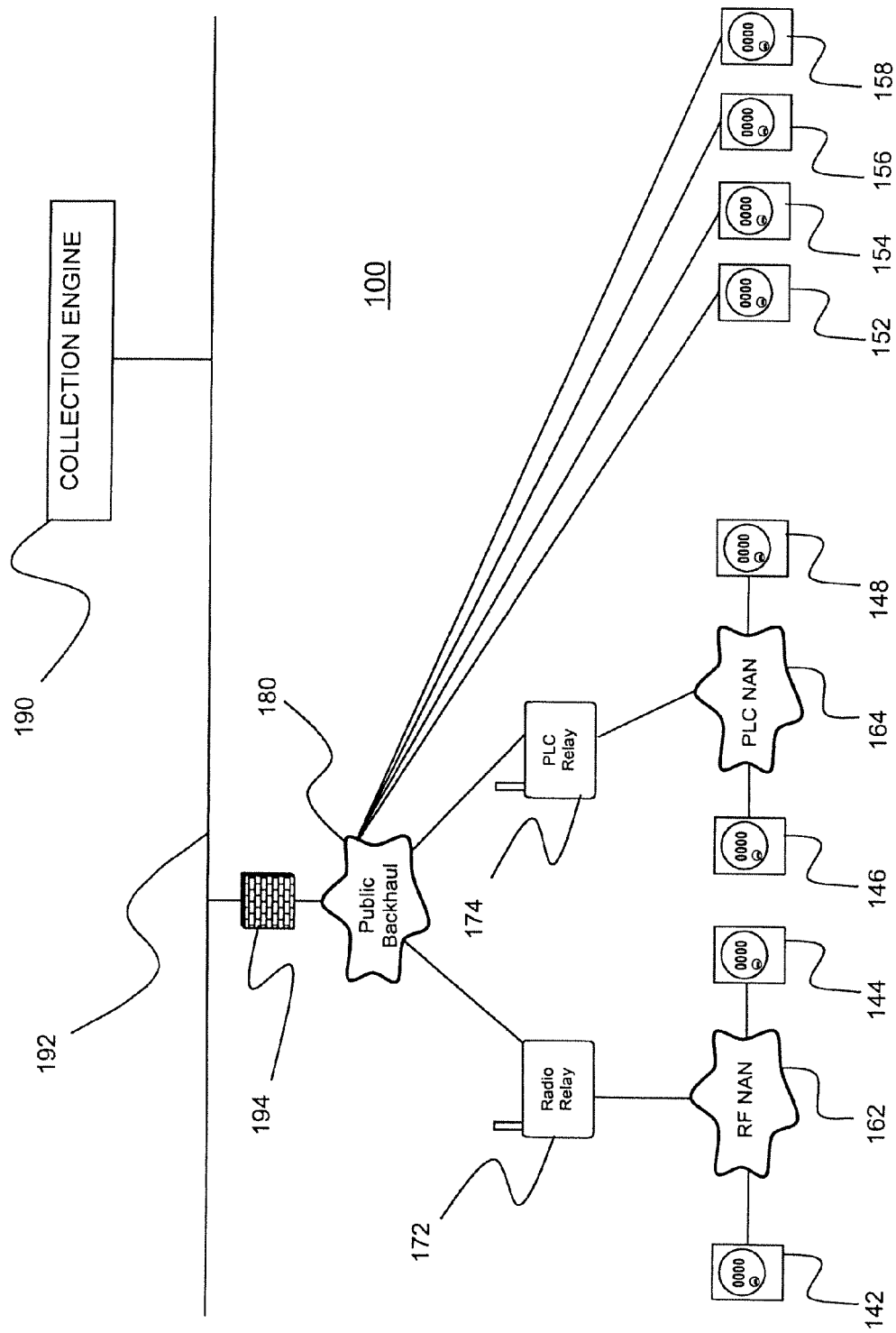
FIG. 1 is a block diagram overview illustration of an Advanced Metering System (AMS) and a representation of corresponding methodology thereof, in accordance with the present subject matter.

Repeat use of reference characters throughout the present specification and appended drawings is intended to represent same or analogous features, elements, or steps of the present subject matter.

DETAILED DESCRIPTION OF THE PREFERRED EMBODIMENTS

As discussed in the Summary of the Invention section, the present subject matter is particularly concerned with the provision of improved methodology and corresponding apparatus allowing efficient responses from metrology devices to requests for data from a requester in an Automated Meter Reading (AMR) network.

Selected combinations of aspects of the disclosed technology correspond to a plurality of different embodiments of the present subject matter. It should be noted that each of the exemplary embodiments presented and discussed herein should not insinuate limitations of the present subject matter. Features or steps illustrated or described as part of one embodiment may be used in combination with aspects of another embodiment to yield yet further embodiments. Additionally, certain features may be interchanged with similar devices or features not expressly mentioned which perform the same or similar function.

Reference will now be made in detail to presently preferred embodiments of the subject methodology and apparatus. Referring to the drawings, FIG. 1 is a block diagram overview illustration of an Advanced Metering System (AMS) in accordance with the present subject matter.

Advanced Metering System (AMS) generally 100 in accordance with the present subject matter is designed to be a comprehensive system for providing advanced metering information and applications to utilities. AMS 100 in pertinent part is designed and built around industry standard protocols and transports, and therefore is intended to work with standards compliant components from third parties.

Major components of AMS 100 include exemplary respective meters 142, 144, 146, 148, 152, 154, 156, and 158; one or more respective radio-based networks including RF neighborhood area network (RF NAN) 162 and its accompanying Radio Relay 172, and power line communications neighborhood area network (PLC NAN) 164 and its accompanying PLC Relay 174; an IP (internet protocol) based Public Backhaul 180; and a Collection Engine 190. Other components within exemplary AMS 100 may include a utility LAN (local area network) 192 and firewall 194 through which communications signals to and from Collection Engine 190 may be transported from and to respective exemplary meters 142, 144, 146, 148, 152, 154, 156, and 158 or other devices including, but not limited to, Radio Relay 172 and PLC Relay 174.

AMS 100 is configured to be transparent in a transportation context, such that exemplary respective meters 142, 144, 146, 148, 152, 154, 156, and 158 may be interrogated using Collection Engine 190 regardless of what network infrastructure exists between or among such components. Moreover, due to such transparency, the meters may also respond to Collection Engine 190 in the same manner.

Throughout the present disclosure, reference is made to various networks generally designated "xAN" corresponding to portions of an overall communications system. A Local Area Network (LAN) may correspond to a utility's internal network, or the IT network. That is the network where servers, such as the collection engine are connected. Typically this is behind a firewall and has access to the public internet. A Wide Area Network (WAN) that may also be referred to as the IP backhaul provides a connection between cell relays and the utility's internal network. Typically this service is provided by a wireless carrier like Cingular®, or Verizon®. Generally this service allows connectivity from a cell relay, over a wireless network, to the internet. Traffic (data) may then be transmitted over the internet to the utility's internal network. A Neighborhood Area Network (NAN) corresponds to a local area RF mesh network providing communications between meters spanning a neighborhood. A Home Area Network (HAN) provides a communications link from the meter into the home and may correspond to a ZigBee link.

As represented by the illustration in FIG. 1, Collection Engine 190 is capable of integrating Radio, PLC, and IP connected meters. To facilitate such transparency, AMS 100 operates and/or interfaces with ANSI standard C12.22 meter communication protocol for networks. C12.22 is a network transparent protocol, which allows communications across disparate and asymmetrical network substrates. C12.22 details all aspects of communications, allowing C12.22 compliant meters produced by third parties to be integrated into a single advanced metering interface (AMI) solution. AMS 100 is configured to provide meter reading as well as load control/demand response, in home messaging, and outage and restoration capabilities. All data flowing across the system is sent in the form of C12.19 tables. The system provides full two-way messaging to every device; however, many of its functions may be provided through broadcast or multicast messaging and session-less communications.

Figure 2A:
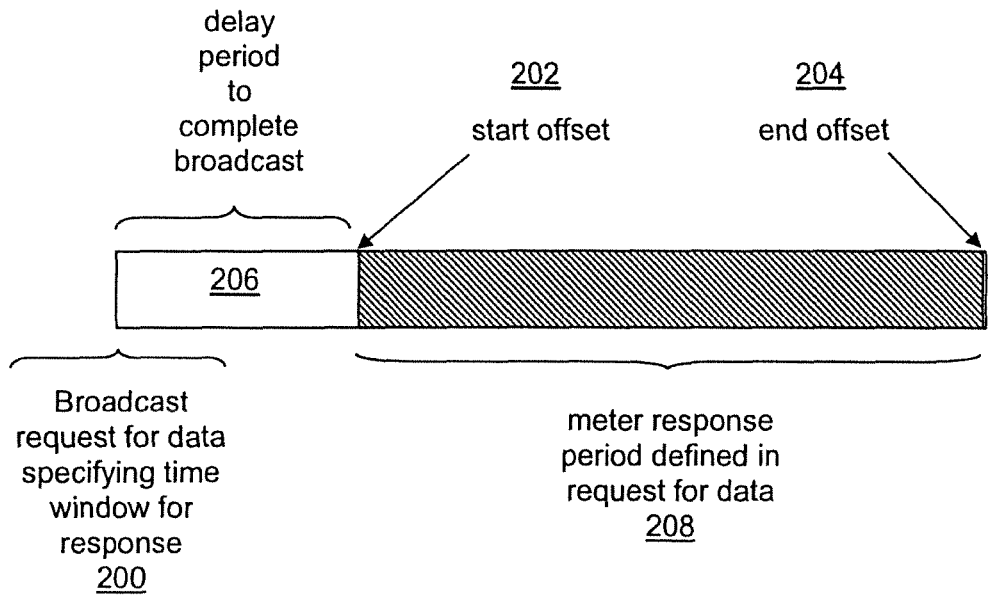
FIG. 2A graphically represents a first embodiment of the methodology and corresponding apparatus of the present subject matter wherein a data requester specifies response parameters.
Figure 2B:
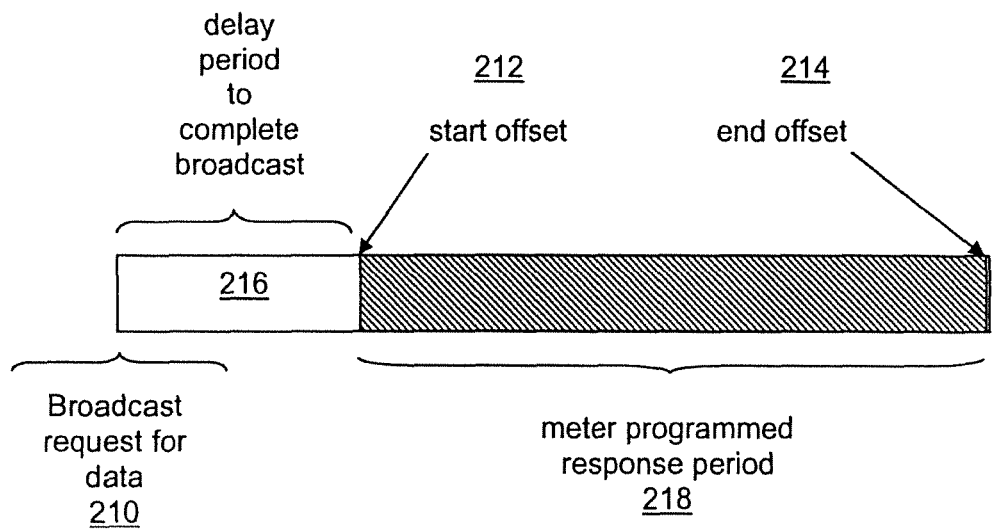
FIG. 2B graphically represents a second embodiment of the methodology and corresponding apparatus of the present subject matter wherein a portion of the data response parameters are programmed into a responding device.

With present reference to FIGS. 2A and 2B, there are illustrated respective first and second exemplary embodiments of methodology and corresponding apparatus of the present subject matter, wherein a data requester initiates response from a meter or meters. Whenever an AMR system needs to retrieve data from a large number of points (meters) over an AMR network, the Collection Engine 190 (FIG. 1) or other components as will be described later, sends in accordance with present subject matter a broadcast or multicast request to the appropriate nodes. In accordance with the present technology, two exemplary configurations (per representative FIGS. 2A and 2B) are provided to respond to the broadcast or multicast request for data.

FIG. 2A illustrates a first embodiment of broadcast or multicast request for data methodology and corresponding apparatus in accordance with the present technology. As illustrated in FIG. 2A, a broadcast request for data generally 200 may be transmitted, which includes in such request response parameters to be followed. Such parameters, per present subject matter, preferably include a start offset generally 202 and an end offset generally 204. Such start offset 202 is specified per present subject matter so that a delay period generally 206 will be insured within which to complete the broadcast request, thereby avoiding any interference from responding meters, all per present subject matter. End offset 204 establishes relative thereto a "no later than" time by which a response is required from each meter. A request for data in this and other embodiments of the present subject matter described herein (such as relating to present FIG. 2B) may also include a control byte that allows the requester to request particular types of data to be returned. In other words, the use of a control byte dynamically returns the correct data for a broadcast, and such technique (as mentioned with reference to present FIG. 2A) may also be used in the FIG. 2B embodiment, such as by storing such control byte in the meter. During such meter response period generally 208, individual meters randomly select a time at which they choose to respond but insuring that such response is transmitted during the period 208 defined in the request for data 200. In other words, individual meters respond randomly beginning at some time following the start offset point 202 but respond no later than the end offset point 204 as specified in the broadcast or multicast request for data generally 200.

FIG. 2B illustrates a second exemplary embodiment of broadcast or multicast request for data methodology and corresponding apparatus in accordance with present technology. As illustrated in FIG. 2B, a broadcast request for data generally 210 may be transmitted that includes a request that data be sent but without specifying any response time parameters to be followed. In the exemplary embodiment of FIG. 2B, data request response parameters may be pre-programmed into the meters themselves. By pre-programming the meters with their own response parameters, broadcast traffic on the network is reduced, thus allowing more response opportunities from the various nodes on the network.

In a manner similar to that of the first exemplary embodiment of the preset subject matter, the response parameters pre-programmed into individual meters include a start offset generally 212 as well as an end offset generally 214. Such pre-programmed start offset 212 establishes a start delay generally 216 during which the broadcast request for data is heard by the individual meter to insure that the broadcast request generally 210 may be completed to all designated meters so as to avoid any interference from responding meters. The pre-programmed end offset 214, similar to that of the broadcast instructions of the first embodiment, establishes a "no later than" time by which a response is required from the individual meter.

In a manner similar to that of the first exemplary embodiment of the present technology, individual pre-programmed meters respond randomly after their pre-programmed start offset 212 but prior to their pre-programmed end offset 214. By providing for random response times within a pre-defined window 218 of response, methodology and corresponding apparatus of the present subject matter permits a significantly simplified data request methodology and corresponding apparatus.

While data collection can be addressed by scheduling AMR nodes to connect at different times or by contacting AMR nodes individually, such a methodology would require a significant amount of time as well as a great deal of program management. Methodology and corresponding apparatus in accordance with the present subject matter allows AMR responses to be distributed randomly over time, thus optimizing the use of available AMR network bandwidth while avoiding the necessity of using advanced management techniques.

With present reference to FIG. 3, it will be seen that an exemplary Advanced Metering System (AMS) generally 300 deployment has been illustrated. FIG. 3 illustrates for exemplary purposes only a single RF NAN cell, with twelve respective member nodes organized into three levels, as well as four directly connected IP meters 370, 372, 374, and 376. In such system, all respective meter devices 310, 320, 330, 332, 340, 342, 350, 352, 354, 356, 360, 362, 364, 466, 370, 372, 374, and 376, Cell Relay 302, and Collection Engine 390, have C12.22 network addresses. Collection Engine 390 may in accordance with the present subject matter have multiple C12.22 addresses to allow for separate addressing between different services (functionalities). Meter (or master) data management system 391 is not part of the C12.22 network, but preferably it will be implemented so as to communicate over the Utility LAN 392 to Collection Engine 390 via Web Services. Communications between Cell Relay 302 and Utility LAN 392 variously involve Public Backhaul 380 and firewall 394, in a manner analogous to that discussed above in conjunction with Public Backhaul 180 and firewall 194 (FIG. 1), as well understood by those of ordinary skill in the art.

The meter data acquisition process begins with the Meter (or Master) Data Management System 391 initiating a request for data. Such operation may be done through a web services call to Collection Engine 390 and may be performed without knowledge of the configured functionality of the end-device. Alternatively, a request for data may be made by other means including, but not limited to, a user interface, a file submission, or a library call to trigger the process. Collection Engine 390 analyzes the request for data, and formulates a series of C12.22 multicast (or broadcast) data requests. Such requests are then sent out either directly to the device (in the case of an IP connected meter, such as 370), or to Cell Relay 302 that relays the message out to all appropriate nodes. Broadcast and multicast messages are sent by Cell Relay 302 to all members of the cell, either via an AMS RF NAN-level broadcast, or by the Cell Relay repeating the message. For efficiency sake, the use of an RF NAN level broadcast may be preferred.

Typically these requests are sent as a call to a manufacturer's stored procedure. In C12.19, stored procedure calls are performed as writes to a predetermined table, e.g. "table 7." The stored procedure will normally send the default upload configured for such device, however, the request for data may specify particular types of data by way of a control byte that may be included with the request. For example, a given meter may be configured to upload two channels of hourly interval data, plus its event history. Another meter might be programmed to send up its TOU registers. The stored procedure will require at least four parameters to be fully operative in accordance with the present subject matter: data start time, data end time, response start time, and response end time. The data start and end time are be used to select which data to send. The response start time and end time are used to determine the window within which the upstream system wants to receive the data. The various AMS enabled meters of FIG. 3 are preferably field programmable, via C12.19 tables, as to the type data to be included in a default upload.

When data is sent to Collection Engine 390, is it sent as C12.19 table self-write with the notification bit set, and the do-not-respond bit set. The result is that per the present subject matter no C12.22 acknowledgement is sent in response to the Collection Engine's broadcast, nor does the Collection Engine 390 in response to the notify-write send any response; however, the notify-write effectively serves per the present subject matter as an acknowledgement to the receipt of the broadcast.

The response processing section can use the configured data about an end device and the response message from the end device to determine the results from the device. The response processing section begins operation associated with a specific job in a task list, but can be switched between any active job that is awaiting a response. Such operation allows responses that contain logs from the device to be parsed by each job that could be waiting for an action to be completed within the end-device. Such also would allow unsolicited messages to be parsed by the Interface between Meter and Application (IMA) code and then later associated with any possible jobs, as determined by the IMA, all in accordance with the present subject matter.

While most operations will not require this, the AMS meters will support chaining a series of EPSEM messages, such as multiple table reads and writes in a single request. This is functionality that is required in the C12.22 specification, and will assist in improving the efficiency of the system, as it avoids the overhead of sending a separate message for each EPSEM command. AMS enabled devices will process each request sequentially, allowing a series of operations to be handled in a single command, each building on the next, such that a read subsequent to a write would reflect the results of the request write. If a command in an EPSEM chain cannot be completed, remaining commands in the chain are rejected with appropriate error messages, per the present subject matter.

When a respective device receives a request, it evaluates the multi-cast address specified. If the device is a member of the multicast group, it responds to the request; otherwise, it discards it. Membership in different multicast groups is determined via use of C12.22 standard table 122.

On-demand reading (i.e., reporting) per the present subject matter is similar to the Daily Meter Data Acquisition Process; however, rather than sending a broadcast or multicast request, the on-demand reading process in accordance with the present subject matter communicates directly to desired respective meters. Such process begins with a user initiated an on-demand read (i.e., an on-demand reporting instruction) through an AMS User Interface, or through a web services call from an upstream system. Per the present subject matter, an orchestration layer of the Collection Engine 390 begins by evaluating the current system load of the communications substrate through which the respective device is connected. Requests for an on-demand read from a saturated cell may be rejected.

Once Collection Engine 390 determines that the request can be honored, it selects per the present subject matter an appropriate communication server within the Collection Engine, and submits the command to retrieve data from the device and return it. The communications server forms a C12.22 table read request, encrypts it, and sends it to the device directly, if IP connected, or to Cell Relay 302 for RF NAN connected devices. In cases where traffic flows through the RF NAN, the Cell Relay software retrieves the message from the IP backhaul 380, and evaluates the message. The destination address (in C12.22 terminology, the called ApTitle) may be stripped off to save bandwidth on the network, relying instead on the underlying RF NAN addressing scheme for delivering the message. The Cell Relay software must also examine whether the destination ApTitle is still valid within the cell. If the destination ApTitle is no longer valid, the Cell Relay rejects the message, returning an error packet to the Collection Engine. Provided that the destination is still valid, the Cell Relay software sends the message to the device across the RF NAN, per the present subject matter.

A protocol stack for the RF NAN advantageously takes the message and constructs a node path for the message to take before actually transmitting the packet. Such pre-constructed node path allows Cell Relay 302 per the present subject matter to push a message down through the tree of the cell without creating redundant radio messages. If Collection Engine 390 wants to do an on-demand read to meter 356, it starts by sending the message to Cell Relay 302. Cell Relay 302 in turn sends out a transmission that will be heard by both respective meters 310 and 320 (in the exemplary configuration of present FIG. 3). Meter 320 could go ahead and retransmit the message, but this wouldn't get the message to meter 356. Instead, it would simply waste bandwidth. With the node path provided to by the RF NAN protocol stack, meters 310 and 320 will hear the message, but per the present subject matter only meter 310 will retransmit the message. The retransmitted message of meter 310 will be heard by both meters 330 and 332, but only meter 332 will be in the node path, again meaning other parts of the cell (such as meters 350 and 352) won't receive a message that would be useless to them. Both meters 354 and 356 will hear the message, but it is only addressed to meter 356. As such, meter 354, per the present subject matter, will simply ignore it.

Figure 4:
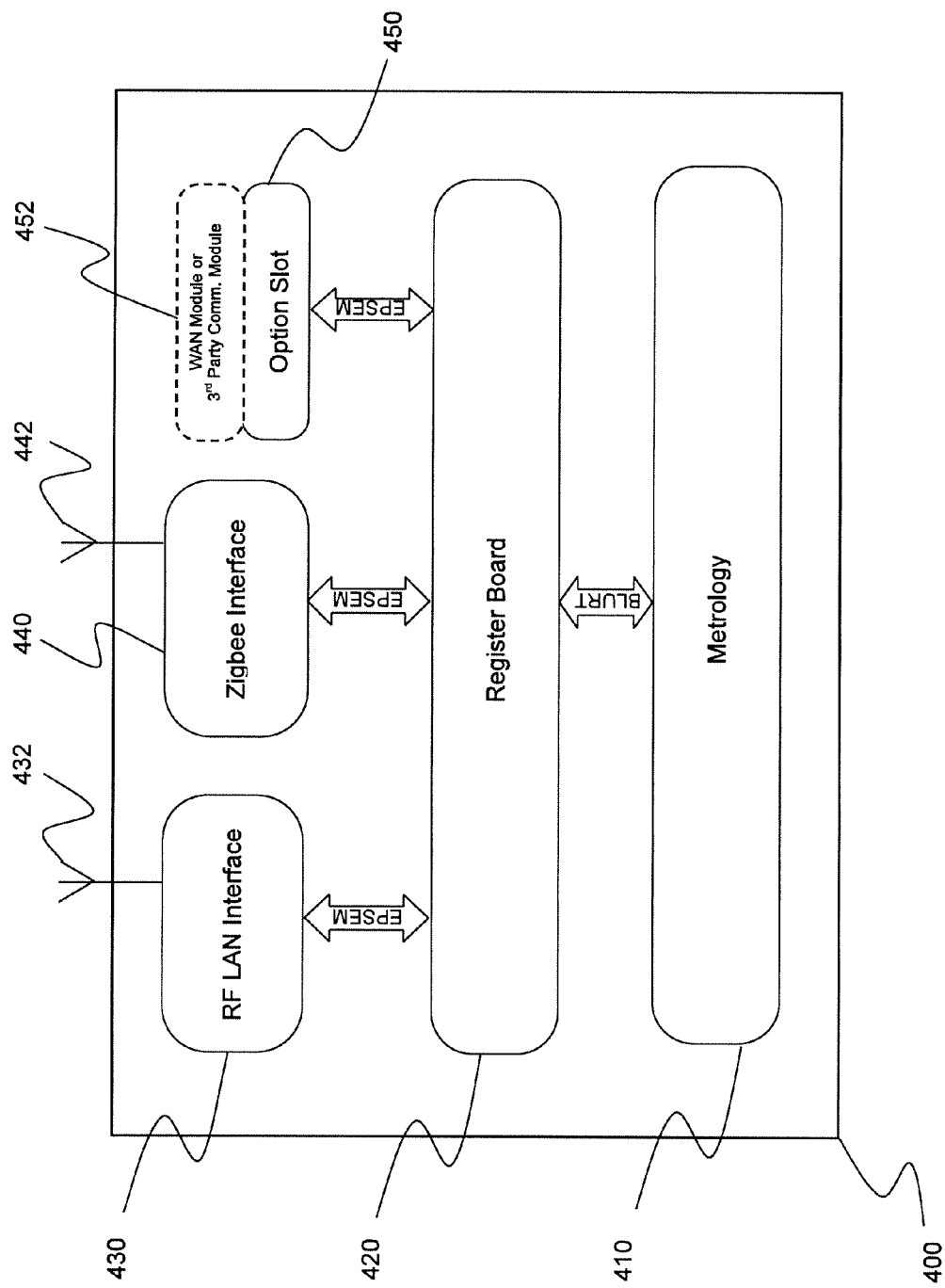
FIG. 4 illustrates a block diagram of an exemplary meter incorporating interface features in accordance with the present subject matter.

Once the message is received at the subject (i.e., intended) meter, whether via RF NAN, IP, RF LAN, PLC, or by alternative third party RF or other type technology, such meter must unpack the request and act on it. The communications module within the device will pull the C12.22 message off the network substrate and provide it to the Register Board 420 (FIG. 4). Register Board 420 will decrypt the message based on shared keys, and then respond to the request, encrypting it and returning it to the calling ApTitle. In the case of the RF NAN, the message is simply forwarded to the next layer up in the cell. Messages are forwarded from one layer to the next until they finally reach Cell Relay 302, which relays it across the IP backhaul 380 to the communications server that initiated the transaction.

With reference now to FIG. 4, there is illustrated a block diagram of an exemplary meter 400 incorporating interface features in accordance with the present subject matter. Meter 400 incorporates several major components including metrology 410, a register board 420 and one or more communications devices. In the presently illustrated configuration, meter 400 may include an RF LAN Interface 430 and accompanying antenna 432 and a Zigbee Interface 440 and its accompanying antenna 442. In addition, an Option Slot 450 may be provided to accommodate a third party network or communications module 452.

Metrology 410 may correspond to a solid-state device configured to provide an internal C12.18 blurt communications to register board 420. Communications within meter 400 is conducted via C12.22 Extended Protocol Specification for Electronic Metering (EPSEM) messages. The meter register board 420 is configured to fully support C12.19 tables and C12.22 extensions. While all meter data will be accessible via standard C12.19 tables, in order to facilitate very low bandwidth communications, manufacturers tables or stored procedures are included which provide access to specific time-bound slices of data, such as the last calendar day's worth of interval data or other customized "groupings" of data.

Meter 400 may be variously configured to provide differing communications capabilities depending on whether the metrology is designed for electricity meters and thus has available a continuously available AC supply source or is configured as a battery operated device to be activated for communications sessions on an intermittent or scheduled basis to monitor water, gas or oil consumption. In exemplary configurations, one or more of GPRS, Ethernet, and RF LAN communications modules may be provided. GPRS will allow meters to be IP addressable over a public backhaul and provide more bandwidth than the meter will ever require, but may incur ongoing subscriptions costs. Ethernet connectivity can be used to bridge to third party technologies, including WiFi, WiMax, in-home gateways, and BPL, without integrating any of these technologies directly into the metering device, but with the tradeoff of external wiring and a two part solution. Ethernet devices may be used primarily in pilots and other special applications; though they may be ideal for certain high-density RF-intolerant environments such as meter closets.

Due to the increased complexity of managing a WAN interface, with its more sophisticated link negotiation requirements and TCP/IP stack, WAN connected meters may include an additional circuit board dedicated to WAN connectivity. This board will interface with meter 400 using EPSEM messages and Option Slot 450.

The availability of Option Slot 450 within meter 400 provides the advantage that it will make meter 400 available for integration with third party backhauls, such as PLC. In order for such third party devices to be integrated into AMS 100, on the other hand, third party devices will need to include both a communications board and a C12.22 compliant relay to couple communications signals from the third party's proprietary network to an IP connection. Alternatively, third parties could integrate meter 400 it into their own end-to-end solution.

The communications protocol between meter 400 and communications modules 430, 440, and WAN module or optional third part communications module 452 follow the C12.22 standards, allowing any third party to design to the standard and be assured of relatively straightforward integration.

While the present subject matter has been described in detail with respect to specific embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. An advanced metering system with meter response load balancing, comprising:
   a plurality of end devices, at least some of which end devices comprise metrology devices; and
   a network including a central facility having collection functionality, said network being configured for bi-directional communications between said central facility and each of said plurality of end devices, and said collection functionality being configured so as to broadcast to at least selected of said metrology devices a request for data, which request for data includes metrology device instructions for responding to said request for data,
   wherein said metrology device instructions include a start offset and an end offset, thereby defining a metrology device response period.

2. An advanced metering system as in claim 1, wherein metrology devices responding to said request for data are configured for respectively responding at random times within said defined metrology device response period.

3. An advanced metering system as in claim 1, wherein said request for data further includes a control byte for requesting particular types of data to be returned by said metrology devices.

4. An advanced metering system as in claim 3, wherein:
   said particular types of data to be returned include at least one of meter reading, load control/demand responses, in home messaging, and restoration operations, such that said collection functionality associates the data returned and the particular type of data requested to discern respective responses from said metrology devices; and
   said network is configured for integrating metrology devices operating with at least one of radio, PLC, and IP connections.

5. An advanced metering system as in claim 1, further comprising at least one cell relay, with said at least one cell relay and said network configured such that bi-directional communication between said central facility and selected of said plurality of said end devices is conducted by way of said at least one cell relay, whereby bi-directional communication between said central facility and said selected of said plurality of said end devices is conducted directly, all of which bi-directional communications are configured for occurring at least in part based on an open standard meter communication protocol.

6. An advanced metering system as in claim 1, wherein:
   said collection functionality is configured to communicate specific on-demand reporting instructions to specific respectively desired metrology devices; and wherein said metrology devices are configured to ignore any broadcast request for data or any on-demand reporting instructions not intended for such respective metrology device.

7. An advanced metering system with meter response load balancing, comprising:
   a plurality of end devices, at least selected of which end devices comprise metrology devices respectively having preprogrammed protocols for responding to requests for data; and
   a network including a central facility having collection functionality, said network being configured for bi-directional communications between said central facility and each of said plurality of end devices, and said collection functionality being configured so as to broadcast to at least some of said metrology devices a request for data,
   wherein said preprogrammed protocols of said metrology devices respectively include a start offset and an end offset, thereby defining a metrology device response period.

8. An advanced metering system as in claim 7, wherein:
   metrology devices responding to said request for data are configured for respectively responding at random times within said defined metrology device response period.

9. An advanced metering system as in claim 7, wherein said request for data includes a control byte for requesting particular types of data to be returned by said metrology devices.

10. An advanced metering system as in claim 9, wherein:
    said particular types of data to be returned include at least one of meter reading, load control/demand responses, in home messaging, and restoration operations, such that said collection functionality associates the data returned and the particular type of data requested to discern respective responses from said metrology devices; and
    said network is configured for integrating metrology devices operating with at least one of radio, PLC, and IP connections.

11. An advanced metering system as in claim 7, further comprising at least one cell relay, with said at least one cell relay and said network configured such that bi-directional communication between said central facility and selected of said plurality of said end devices passes through said at least one cell relay, whereby bi-directional communication between said central facility and said selected of said plurality of said end devices is conducted by way of said at least one cell relay while bi-directional communication between said facility and others of said plurality of said end devices is conducted directly, all of which bi-directional communications are configured for occurring at least in part based on an open standard meter communication protocol.

12. An advanced metering system as in claim 7, wherein:
    said collection functionality is configured to broadcast specific on-demand reading instructions to specific respectively desired metrology devices; and
    said metrology devices are configured to ignore any broadcast request for data or any on-demand reading instructions not intended for such respective metrology device.

13. Methodology for an advanced metering system with meter response load balancing, comprising:
    providing a plurality of end devices, at least selected of which end devices comprise metrology devices;
    establishing a network including a central facility having collection functionality;
    configuring the network for bi-directional communications between such central facility and each of the plurality of end devices; and
    using such collection functionality to broadcast to at least selected of the metrology devices a request for data, which request for data includes metrology device instructions for responding to the request for data,
    wherein said metrology device instructions include a start offset and an end offset, thereby defining a metrology device response period.

14. Methodology as in claim 13, wherein metrology devices responding to such request for data respectively respond at random times within the defined metrology device response period.

15. Methodology as in claim 13, wherein the request for data further includes a control byte for requesting particular types of data to be returned by the metrology devices.

16. Methodology as in claim 15, further comprising:
    using the collection functionality to communicate specific on-demand reporting instructions to specific respectively desired metrology devices; and wherein
    the particular types of data to be returned include at least one of meter reading, load control/demand responses, in home messaging, and restoration operations;
    the collection functionality associates the data returned and the particular type of data requested to discern respective responses from the metrology devices;
    the network is configured for integrating metrology devices operating with at least one of radio, PLC, and IP connections; and
    the metrology devices are configured to ignore any broadcast request for data or any on-demand reporting instructions not intended for such respective metrology device.

17. Methodology as in claim 13, wherein:
    establishing a network further includes:
       providing at least one cell relay; and
       configuring the network such that bi-directional communication between the central facility and selected of the plurality of end devices passes through the at least one cell relay, so that bi-directional communication between the central facility and selected of the plurality of end devices is conducted by way of the cell relay while bi-directional communication between the central facility and others of the plurality of end devices is conducted directly; and
    all of such bi-directional communications are configured for occurring at least in part based on an open standard meter communication protocol.

18. Methodology for an advanced metering system with meter response load balancing, comprising:
    providing a plurality of end devices, at least selected of which end devices comprise metrology devices respectively having preprogrammed protocols for responding to requests for data;
    establishing a network including a central facility having collection functionality;
    configuring the network for bi-directional communications between said central facility and each of the plurality of end devices; and
    using such collection functionality to broadcast to at least selected of the metrology devices a request for data,
    wherein the preprogrammed protocols of the metrology devices respectively include a start offset and an end offset, thereby defining a metrology device response period.

19. Methodology as in claim 18, wherein:
    metrology devices to the request for data are configured for respectively responding at random times within the defined metrology device response period.

20. Methodology as in claim 18, wherein the request for data includes a control byte for requesting particular types of data to be returned by the metrology devices.

21. Methodology as in claim 20, wherein:
   the particular types of data to be returned include at least one of meter reading, load control/demand responses, in home messaging, and restoration operations, such that the collection functionality associates the data returned and the particular type of data requested to discern respective responses from the metrology devices; and
   the network is configured for integrating metrology devices operating with at least one of radio, PLC, and IP connections.

22. Methodology as in claim 18, wherein:
   establishing a network further includes:
      providing at least one cell relay; and
      configuring the network such that bi-directional communication between the central facility and selected of the plurality of end devices passes through the at least one cell relay, so that bi-directional communication between the central facility and selected of the plurality of end devices is conducted by way of the cell relay while bi-directional communication between the central facility and others of the plurality of end devices is conducted directly; and
   all of such bi-directional communications are configured for occurring at least in part based on an open standard meter communication protocol.

23. Methodology as in claim 18, further comprising:
   using the collection functionality to communicate specific on-demand reporting instructions to specific respectively desired metrology devices; and
   wherein the metrology devices are configured to ignore any broadcast request for data or any on-demand reporting instructions not intended for such respective metrology device.

* * * * *